US012811114B2

(12) United States Patent
Good et al.

(10) Patent No.: US 12,811,114 B2
(45) Date of Patent: Nov. 24, 2026

(54) METHOD OF SPUTTER-COATING SUBSTRATES OR OF MANUFACTURING SPUTTER COATED SUBSTRATES AND APPARATUS

(71) Applicant: EVATEC AG, Trübbach (CH)

(72) Inventors: Romeo Good, Walenstadt (CH); Silvia Schwyn Thöny, Wangs (CH); Marco Padrun, Maienfeld (CH); Edmund Schüngel, Buchs (CH); Silvio Gees, Bad Ragaz (CH)

(73) Assignee: EVATEC AG, Trübbach (CH)

( * ) Notice: Subject to any disclaimer, the term of this patent is extended or adjusted under 35 U.S.C. 154(b) by 126 days.

(21) Appl. No.: 17/757,098

(22) PCT Filed: Nov. 20, 2020

(86) PCT No.: PCT/EP2020/082850
§ 371 (c)(1),
(2) Date: Jun. 9, 2022

(87) PCT Pub. No.: WO2021/115758
PCT Pub. Date: Jun. 17, 2021

(65) Prior Publication Data

US 2023/0005725 A1 Jan. 5, 2023

(30) Foreign Application Priority Data

Dec. 13, 2019 (CH) ...................................... 1620/19

(51) Int. Cl.
*H01J 37/34* (2006.01)
*C23C 14/00* (2006.01)
(Continued)

(52) U.S. Cl.
CPC ...... *H01J 37/3452* (2013.01); *C23C 14/0057* (2013.01); *C23C 14/0063* (2013.01);
(Continued)

(58) Field of Classification Search
CPC .. H01J 37/3452; H01J 37/345; H01J 37/3405; H01J 37/3408; H01J 37/3423;
(Continued)

(56) References Cited

U.S. PATENT DOCUMENTS 5,182,003 A 1/1993 Maass et al.
5,374,343 A * 12/1994 Sasaki .................... C23C 14/35 204/192.12
(Continued)

FOREIGN PATENT DOCUMENTS

EP 2378538 A2 10/2011
JP S63247366 A 10/1988
(Continued)

OTHER PUBLICATIONS

International Search Report for PCT/EP2020/082850 dated Feb. 11, 2021.
Written Opinion for PCT/EP2020/082850 dated Feb. 11, 2021.

*Primary Examiner* — Michael A Band
(74) *Attorney, Agent, or Firm* — McDonald Hopkins LLC

(57) ABSTRACT

Whenever substrates are rotationally and continuously conveyed in a vacuum recipient around a common axis and past a magnetron sputter source, sputtering of the target, rotating around a central target axis, by the stationary magnetron plasma is adapted to the azimuthal extents radially differently spaced areas of the substrates become exposed to the target thereby improving homogeneity of deposited layer thickness on the substrates and ensuring that the complete sputter surface of the target is net-sputtered.

17 Claims, 11 Drawing Sheets

Figure 1:
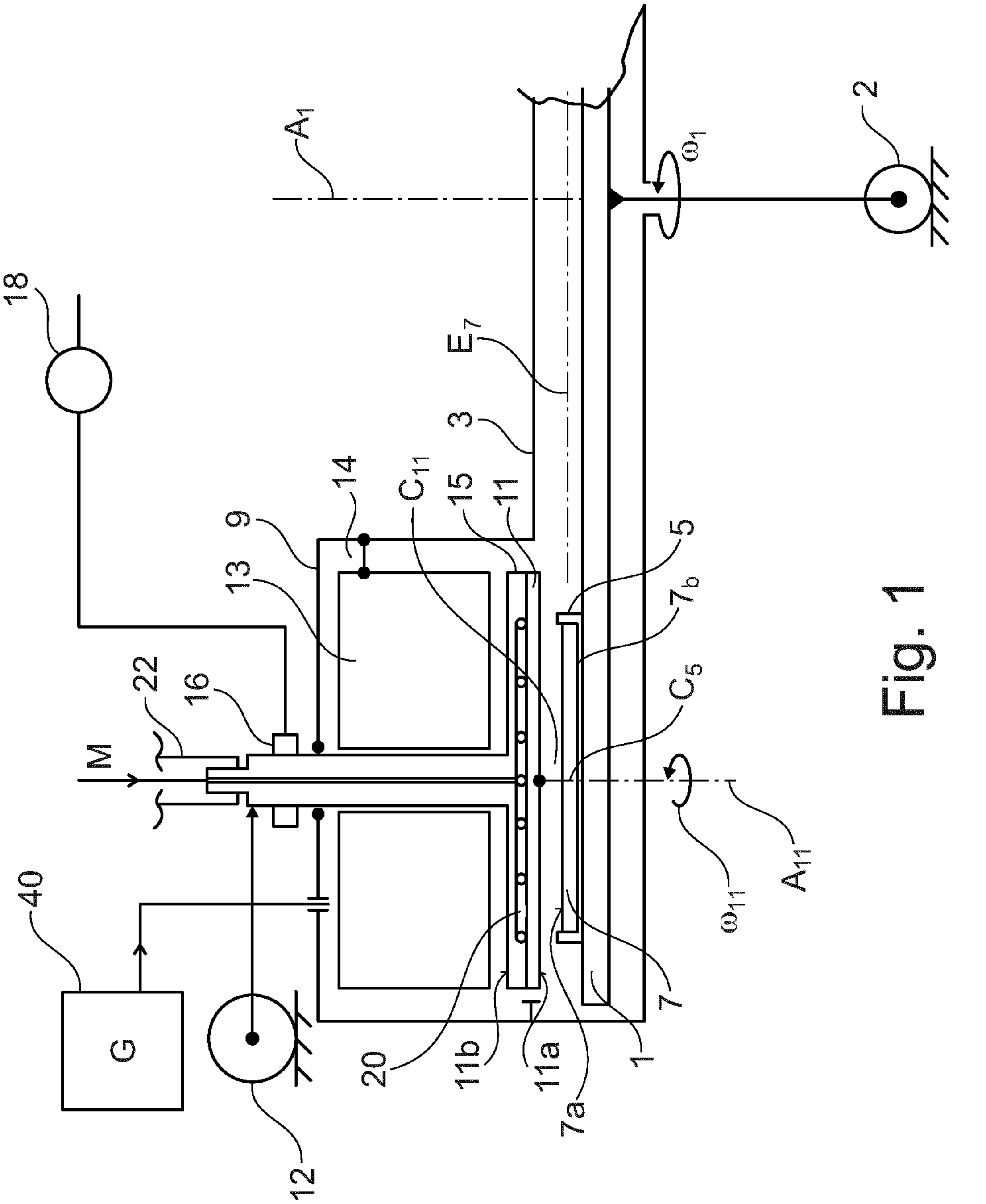

(51) Int. Cl.

| | |
|---|---|
| ***C23C 14/14*** | (2006.01) |
| ***C23C 14/35*** | (2006.01) |
| ***C23C 14/50*** | (2006.01) |

(52) U.S. Cl.
CPC .............. *C23C 14/14* (2013.01); *C23C 14/35* (2013.01); *C23C 14/505* (2013.01); *H01J 37/3405* (2013.01); *H01J 37/3408* (2013.01); *H01J 37/3423* (2013.01); *H01J 37/345* (2013.01)

(58) Field of Classification Search
CPC ..... C23C 14/0057; C23C 14/14; C23C 14/35; C23C 14/505; C23C 14/352
See application file for complete search history.

(56) References Cited

U.S. PATENT DOCUMENTS

| | | | | | |
|---|---|---|---|---|---|
| 5,879,519 | A * | 3/1999 | Seeser | ........................ | C23C 8/02<br>427/538 |
| 9,771,647 | B1 * | 9/2017 | Scobey | ............... | H01J 37/3408 |
| 10,043,642 | B2 * | 8/2018 | Zueger | ................ | H01J 37/3405 |

FOREIGN PATENT DOCUMENTS

| | | | |
|---|---|---|---|
| JP | H049469 | A | 1/1992 |
| WO | 2017042123 | A1 | 3/2017 |
| WO | 2019087724 | A1 | 5/2019 |

* cited by examiner

METHOD OF SPUTTER-COATING SUBSTRATES OR OF MANUFACTURING SPUTTER COATED SUBSTRATES AND APPARATUS

The present invention is directed to a method of sputter-coating substrates with two opposed, two-dimensionally extended surfaces or of manufacturing sputter coated substrates with two opposed, two-dimensionally extended surfaces, also called "plate shaped" substrates. Thereby more than one plate-shaped substrates are continuously rotated around a common axis and, considered in radial direction with respect to the common axis, equally distant from the substrates. The substrates are thus continuously rotated along a common ring-locus around the common axis. The ring-locus has an inner and an outer periphery as well as a center line i.e. a circular locus line centered between the outer and the inner peripheries of the ring-locus.

During their rotational movement around the common axis, the substrates are passed over at least one magnetron sputter source. The magnetron sputter source comprises a stationary magnetron-magnet arrangement and a circular target with a target center and a target center axis and a sputter surface which faces towards the ring-locus. The stationary magnetron magnet-arrangement generates an area of magnetron plasma along the sputter surface of the target.

Definition

We understand under a "magnetron magnet-arrangement" an arrangement of magnets—at least predominantly of permanent magnets—adjacent to the backside of the target, i.e. adjacent to that side of the target which is opposite to the sputter surface. The magnetron magnet-arrangement generates a magnetic field with magnetic field lines arcing over the sputter surface in at least one tunnel like pattern which, seen towards the sputter surface, is close looped. We call this magnetic field "magnetron magnetic field". The magnetron magnet-arrangement comprises at least one loop of magnetic pole surfaces of one magnetic polarity facing the target backside and, nested within that loop, an arrangement of magnetic pole surfaces of the other magnetic polarity facing the target backside. The arrangement of magnetic pole surfaces nested within the addressed loop of magnetic pole surfaces may be a loop of magnetic poles surfaces as well. The magnetron magnet arrangement may comprise more than one of the addressed loops of magnetic pole surfaces and of the respectively nested arrangements of magnetic pole surfaces. The magnetic pole surfaces may be surfaces of magnets, of magnets linked by a magnetic yoke arrangement, of pole shoes from magnets etc.

We understand under the term "area of magnetron plasma" the close-looping area along the sputter surface of the target, along which a plasma burns with increased intensity compared to plasma burning aside that area. The area of magnetron plasma follows the magnetron magnetic field generated by the magnetron magnet-arrangement and has a plasma-intensity distribution substantially proportional to the directional magnetron magnetic field components parallel to the sputter surface, i.e. perpendicular to the electric field impinging on the target-cathode. It is along the area of magnetron plasma that the sputter surface is most eroded or sputtered off, leading to the so called "race-tracks" in the sputter surface. Accordingly, it is along the area of magnetron plasma, defined by the magnetron magnet-arrangement, that the substrate is most sputter coated. Due to the interaction of the angled electric field and magnetron magnetic field, electrons are trapped in and along the magnetron magnetic field so that the area of magnetron plasma is often also called "electron trap".

From the U.S. Pat. No. 5,182,003 it is known to thereby compensate variations of layer thickness deposited on one of the two-dimensionally extended surfaces of the substrates by sputtering as addressed above and thereby by establishing a first azimuthal extent of the area of magnetron plasma, and, with respect to said common axis, radially closer to the outer periphery of the ring-locus than to the inner periphery of the ring locus and by establishing a second azimuthal extent of the area of magnetron plasma smaller than the first azimuthal extent and, with respect to said common axis, radially closer to the inner periphery of the ring-locus than to the outer periphery of the ring locus.

Definition

We understand under the term "azimuthal extent" the length of an arc on a circle around the common axis, also called first axis.

We understand under the term "azimuthal spacing" the spacing between two areas linked by an arc on a circle around the common axis.

It is an object of the present invention to improve such known technique.

This is achieved according to the present invention by a method of sputter-coating substrates with two opposed two-dimensionally extended surfaces or of manufacturing sputter coated substrates with two opposed two-dimensionally extended surfaces, comprising:

continuously rotating more than one substrate around a common axis, and, with respect to the common axis, radially equally distant from the substrates, and along a ring-locus comprising, considered in radial direction with respect to said common axis, an inner periphery, an outer periphery and a center line;

passing one of the two-dimensionally extended surfaces over at least one magnetron sputter source comprising a circular target with a sputter surface towards the ring-locus, a target center on the sputter surface, a target center axis and with a stationary magnetron-magnet arrangement generating an area of magnetron plasma along the sputter surface;

reducing, by means of the magnetron magnet arrangement, variations of layer thickness deposited on the substrates by:

a1) establishing a first azimuthal extent of the area of magnetron plasma and, with respect to the common axis, radially closer to the outer periphery of the ring-locus than to the inner periphery of the ring-locus;

b1) establishing a second azimuthal extent of the area of magnetron plasma smaller than the first azimuthal extent and, with respect to the common axis, radially closer to the inner periphery of the ring-locus than to the outer periphery of the ring-locus;

c1) establishing a third azimuthal extent of the area of magnetron plasma and, with respect to the common axis, radially between the first and the second azimuthal extents, which third azimuthal extent being smaller than the second azimuthal extent;

d1) covering the center of the circular target by the area of magnetron plasma; and rotating the target around the target center axis.

By establishing, by means of the magnetron magnet-arrangement, a third azimuthal extent of the area of magnetron plasma smaller than the second azimuthal extent between the first and second azimuthal extents according to step c1), the increased azimuthal extent of the circular target towards the target center is taken in account.

Because the stationary magnetron magnet-arrangement only generates an area of magnetron plasma along a restricted area of the sputter surface and net redeposition i.e. of a remaining redeposition in spite of simultaneous sputtering off, especially of a material different from the target material on the target is to be minimized or even avoided, the target is rotated around its center axis and the center of the circular target is covered by the area of magnetron plasma. Thereby the overall sputter surface of the target becomes net redeposited to a minimum or even net sputtered and net redeposition is minimized or even avoided. Additionally, exploitation of the target material is improved.

Definition

We understand under the term "net sputtering" and "net redeposition" the balance of simultaneously occurring off-sputtering of material and of redeposition of material.

If sputtering is performed in an atmosphere containing at least one reactive gas, the material deposited on the substrates and which could redeposit on the sputter surface consists of the material sputtered off the sputter surface reacted with the at least one reactive gas. Especially in this case net redeposition is to be minimized or even avoided.

One variant of the method according to the invention comprises establishing the third azimuthal extent of the area of magnetron plasma with respect to the common axis, radially centered between said first and said second azimuthal extents.

One variant of the method according to the invention comprises establishing said third azimuthal extent of said area of magnetron plasma with respect to said common axis, radially aligned with said center line of said ring-locus.

Instead of adjusting the respective azimuthal extents as addressed above under a first approach, under a second approach, the object of the present invention is also resolved, according to the invention, by adjusting the respective averaged strength of the magnetron magnetic field.

This is achieved by a method of sputter-coating substrates with two opposed, two-dimensionally extended surfaces or of manufacturing sputter coated substrates with two opposed two-dimensionally extended surfaces, comprising:

continuously rotating more than one substrate around a common axis equally distant from the substrates and perpendicular to a substrate plane along which the two-dimensionally extended surfaces of the substrates extend and along a ring-locus comprising an inner periphery, an outer periphery and a center line;

passing the one of the two-dimensionally extended surfaces over at least one magnetron sputter source comprising a circular target with a target center on the sputter surface, a target center axis and a sputter surface facing said ring-locus and a stationary magnetron-magnet arrangement generating an area of magnetron plasma along the sputter surface;

reducing, by means of the magnetron magnet-arrangement, variations of layer thickness deposited on the substrates by:

a2) establishing a first averaged strength of magnetron magnetic field and, with respect to the common axis, radially closer to the outer periphery of the ring-locus than to the inner periphery of the ring-locus;

b2) establishing a second averaged strength of magnetron magnetic field smaller than the first averaged strength of magnetron magnetic field and, with respect to the common axis, radially closer to the inner periphery of the ring-locus than to the outer periphery of the ring-locus;

c2) establishing a third averaged strength of magnetron magnetic field at a locus, with respect to the common axis, radially between applying the first and the second averaged strengths, the third averaged strength being smaller than the second averaged strength;

d2) covering the center of the circular target by the area of magnetron plasma; and rotating the target around the target center axis.

Definition

We understand under the term "averaged strength of magnetron magnetic field" closer to the outer periphery, closer to the inner periphery and therebetween, the strength of magnetron magnetic field averaged over the azimuthal extent at the addressed loci along the sputter surface.

One variant of the method according to the invention as just addressed comprises establishing the third averaged strength of magnetron magnetic field at a locus, with respect to the common axis, radially centered between applying the first and the second averaged strengths.

One variant of the method according to the invention as just addressed comprises establishing the third averaged strength of magnetron magnetic field at a locus, with respect to the common axis, radially aligned with the center line of the ring-locus.

One variant of the invention under the first approach, comprises additionally establishing a first averaged strength of magnetron magnetic field, with respect to the common axis, radially closer to the outer periphery of the ring-locus and establishing a second averaged strength of magnetron magnetic field smaller than the first averaged strength of magnetron magnetic field, with respect to the common axis, radially closer to the inner periphery of the ring-locus than to the outer periphery of the ring-locus.

One variant of the variant as just addressed comprises establishing a third averaged strength of magnetron magnetic field, with respect to the common axis, radially between the first averaged strength and the second averaged strength which third averaged strength of magnetron magnetic field being smaller than the second averaged strength of magnetron magnetic field.

One variant of the just addressed variant comprises establishing the third averaged strength of magnetron magnetic field, with respect to the common axis, radially centered between the first averaged strength and the second averaged strength.

Additionally, or alternatively one variant of the method according to the invention comprises establishing the third averaged strength of magnetron magnetic field, with respect to the common axis, radially aligned with the center line of the ring-locus.

The sputter deposition homogeneity along the substrate may be additionally tuned by the variant of the methods according to the invention wherein the sputter surface in new state extends along a sputter surface plane and the magnet pole surfaces of the magnetron magnet arrangement extend along a magnet arrangement plane, the sputter surface plane and the magnet arrangement plane intersecting at an angle α of $$0° < \alpha \leq 20°.$$

In an alternative variant of the methods according to the invention to the just addressed tilting or additionally thereto the sputter surface in new state extends along a sputter surface plane and a substrate aligned with the sputter source extends along a substrate plane, the sputter surface plane and the substrate plane intersecting at an angle α of $$0° < \alpha \leq 20°.$$

In an alternative variant of the methods according to the invention to the just addressed tiltings or additionally thereto a target backside extends along a backside plane and magnet pole surfaces of said magnetron magnet arrangement extend along a magnet arrangement plane, the backside plane and the magnet arrangement plane intersecting at an angle α of $$0° < \alpha \leq 20°.$$

In an alternative variant of the methods according to the invention and to the just addressed tiltings or additionally thereto, a target backside extends along a backside plane and a substrate aligned with said sputter source extends along a substrate plane, the backside plane and the substrate plane intersecting at an angle α of $$0° < \alpha \leq 20°.$$

In an alternative variant of the methods according to the invention and to the just addressed tiltings or additionally thereto the sputter surface in new state extends along a sputter surface plane and a target backside extends along a backside plane, the backside plane and the sputter surface plane intersecting at an angle α of $$0° < \alpha \leq 20°.$$

In an alternative variant of the methods according to the invention and to the just addressed tiltings or additionally thereto a substrate aligned with the sputter source extends along a substrate plane and magnet pole surfaces of the magnetron magnet arrangement extend along a magnet arrangement plane, the substrate plane and the magnet arrangement plane intersecting at an angle α of $$0° < \alpha \leq 20°.$$

Thereby a further variant of the methods according to the invention comprises performing the addressed intersecting along an intersecting line perpendicular to a plane containing the common axis and the target center.

In one variant of the methods according to the invention the addressed angle α is selected to be:

$$0° < \alpha \leq 10°.$$

In one variant of the methods according to the invention, the area of magnetron plasma, referring to the angular position with respect to the target center and with angle zero in outwards direction along a radial line between the common axis and the target center, is tailored as follows:

- Over a range from 0° up to 170° to 190°: along the periphery of the circular target:
- Subsequently: bent inwards to pass over the target center, and
- Subsequently: bent outwards towards the periphery of the circular target;
- Subsequently: along the periphery of the circular target back to 0°.

In one variant of the just addressed variant of the methods according to the invention, the area of magnetron plasma is generated along the periphery of the circular target as a secant starting at an angle in the range of 30° to 50°.

In one variant of the methods according to the invention, in which the substrates are circular, the substrates are respectively drivingly rotated around a substrate center axis which is perpendicular to the opposed two dimensionally extended surfaces.

In one variant of the methods according to the invention, the target center is aligned with the center line of the ring-locus.

In one variant of the methods according to the invention the target is of silicon.

In one variant of the methods according to the invention sputtering is performed from the target in an atmosphere containing at least one reactive gas and a layer of sputtered off material, reacted with the at least one reactive gas, is deposited on the substrates.

In one variant of the methods according to the invention the reactive gas is one of hydrogen and of oxygen.

One variant of the methods according to the invention comprises passing the one of the two two-dimensionally extended surfaces over at least two of the addressed sputter sources.

One variant of the methods according to the invention, comprises passing the one of the two two-dimensionally extended surfaces over at least two of the addressed sputter sources, the targets of the at least two sputter sources being of silicon, performing sputtering from the targets in respective atmospheres containing at least one reactive gas and depositing on the substrates respective layers of sputtered off material, reacted with the at least one reactive gas, the reactive gas at one of the at least two sputter sources being oxygen, the reactive gas at the other of the at least two sputter sources being hydrogen.

Two or more than two of the addressed variants of the methods according to the invention may be combined if they are not contradictory.

Under a first approach, the object outlined above is further resolved according to the invention by a sputter coating apparatus for substrates with two opposed two-dimensionally extended surfaces comprising

- a substrate conveyer in a housing drivingly rotatable around a first axis and comprising more than one substrate support radially equally distant from the first axis, the substrate supports being thereby rotationally movable along a ring-locus, the ring locus having, considered in radial direction with respect to the first axis, an outer periphery, an inner periphery and a center line;
- at least one sputter source comprising a circular target with a sputter surface towards the ring locus, a target center on the sputter surface, a target center axis and a backside opposite the sputter surface, further a stationary magnetron magnet-arrangement facing the backside;
- the stationary magnetron magnet arrangement comprising a first magnet arrangement defining an outer closed loop of magnet pole surfaces of one magnetic polarity facing the backside and a second magnet arrangement with magnet pole surfaces of the other magnetic polarity facing the backside and nested within the closed loop;
- a first azimuthal spacing between the first and the second magnet arrangements and, with respect to the first axis, radially closer to the outer periphery of the ring-locus than to the inner periphery of the ring locus;

a second azimuthal spacing between the first and the second magnet arrangements and, with respect to the first axis, radially closer to the inner periphery of the ring locus than to the outer periphery of the ring locus and being shorter than the first azimuthal spacing;

a third azimuthal spacing between the first and the second magnet arrangements and, with respect to the first axis, radially located between the first and the second azimuthal spacings and being shorter than the second azimuthal spacing;

the target center being located in a spacing between the first and the second magnet arrangements;

the target being drivingly rotatable around the target center axis.

In an embodiment of the apparatus according to the invention the third azimuthal spacing is, with respect to the first axis, radially centered between the first and the second azimuthal spacings.

In an embodiment of the apparatus according to the invention the third azimuthal spacing is, with respect to the first axis, radially aligned with the center line of the ring-locus.

Under a second approach, the object outlined above is also resolved according to the invention by a sputter coating apparatus for substrates with two opposed two-dimensionally extended surfaces comprising:

a substrate conveyer in a housing drivingly rotatable around a first axis and comprising more than one substrate support, radially equally distant from the first axis, the substrate supports being thereby rotationally movable along a ring-locus, the ring locus having, considered in radial direction with respect to the first axis, an outer periphery, an inner periphery and a center line;

at least one sputter source comprising a circular target with a sputter surface towards the ring locus, a target center on the sputter surface, a target center axis and a backside opposite the sputter surface, further a stationary magnetron magnet-arrangement facing the backside;

the stationary magnetron magnet arrangement comprising a first magnet arrangement defining an outer closed loop of magnet pole surfaces of one magnetic polarity facing the backside and a second magnet arrangement with magnet pole surfaces of the other magnetic polarity facing the backside and nested within the closed loop;

a first averaged magnetron magnetic field strength over the sputter surface and over a first azimuthal spacing between the first and the second magnet arrangements and, with respect to the first axis, radially closer to the outer periphery of the ring locus than to the inner periphery of the ring locus;

a second averaged magnetron magnetic field strength weaker than the first averaged magnetic field strength, over the sputter surface and over a second azimuthal spacing between the first and the second magnet arrangements and, with respect to the first axis, radially closer to the inner periphery of the ring-locus than to the outer periphery of the ring-locus;

a third averaged magnetron magnetic field strength over the sputter surface and over a third azimuthal spacing between the first and the second magnet arrangements located, with respect to the first axis, radially between the first and the second azimuthal spacings and being weaker than the second magnetic field strength;

the target center being located in a spacing between the first and the second magnet arrangements;

the target being drivingly rotatable around the target center axis.

In one embodiment of the apparatus as just addressed, the third averaged strength is located, with respect to the common axis, radially centered between the first and the second averaged strengths.

In one embodiment of the apparatus as just addressed the third averaged strength is located, with respect to the first axis, radially aligned with the center line of the ring-locus.

An embodiment of the apparatus under the first approach comprises additionally a first averaged magnetron magnetic field strength over the sputter surface and over a first azimuthal spacing between the first and the second magnet arrangements and, with respect to the first axis, radially closer to the outer periphery of the ring-locus than to the inner periphery of ring-locus;

a second averaged magnetron magnetic field strength weaker than the first averaged magnetic field strength, over the sputter surface and over a second azimuthal spacing between the first and the second magnet arrangements and, with respect to the first axis, radially closer to the inner periphery of the ring-locus than to the outer periphery of the ring-locus.

An embodiment of the just addressed embodiment of the apparatus according to the invention comprises a third averaged magnetron magnetic field strength over the sputter surface and over a third azimuthal spacing between the first and the second magnet arrangements located, with respect to the first axis, radially between the first and the second azimuthal spacings and being weaker than the second averaged magnetic field strength.

In an embodiment of the just addressed embodiment of the apparatus according to the invention, the third averaged magnetron field strength is, with respect to the first axis, radially between the first averaged magnetron field strength and the second averaged magnetron field strength.

Additionally, or alternatively to the embodiment of the apparatus as just addressed, in an embodiment of the apparatus according to the invention the third averaged magnetron field strength is, with respect to the first axis, radially aligned with the center line of the ring-locus.

In one embodiment of the apparatus according to the invention, the sputter surface in new state extends along a sputter surface plane and magnet pole surfaces of said magnetron magnet arrangement extend along a magnet arrangement plane the sputter surface plane and the magnet arrangement plane intersecting at an angle α of $$0° < \alpha \leq 20°.$$

In one embodiment of the apparatus according to the invention the sputter surface in new state extends along a sputter surface plane and a substrate aligned with the sputter source extends along a substrate plane, the sputter surface plane and the substrate plane intersecting at an angle α of $$0° < \alpha \leq 20°.$$

In one embodiment of the apparatus according to the invention the target backside extends along a backside plane and magnet pole surfaces of the magnetron magnet arrangement extend along a magnet arrangement plane, the backside plane and the magnet arrangement plane intersecting at an angle α of $$0° < \alpha \leq 20°.$$

In one embodiment of the apparatus according to the invention the target backside extends along a backside plane and a substrate aligned with the sputter source extends along a substrate plane, the backside plane and the substrate plane intersecting at an angle α of $$0° < \alpha \leq 20°.$$

In one embodiment of the apparatus according to the invention the sputter surface in new state extends along a sputter surface plane and a target backside extends along a backside plane, the backside plane and the sputter surface plane intersecting at an angle α of $$0° < \alpha \leq 20°.$$

In one embodiment of the apparatus according to the invention a substrate aligned with the sputter source extends along a substrate plane and magnet pole surfaces of said magnetron magnet arrangement extend along a magnet arrangement plane, the substrate plane and the magnet arrangement plane intersecting at an angle α of $$0° < \alpha \leq 20°.$$

In one embodiment of the apparatus according to the invention the addressed planes intersect along a line perpendicular to a plane containing the first axis and the target center.

In one embodiment of the apparatus according to the invention there is valid:

$$0° < \alpha \leq 10°.$$

In one embodiment of the apparatus according to the invention the first magnet arrangement defines a loop, referring to the angular position with respect to the target center and with the outwards radial direction from the first axis to said target center as angel zero, as follows:

- Over a range from 0° up to 170° to 190°: along the periphery of the circular target:
- Subsequently: bent inward to pass over the target center, and
- Subsequently: bent outwards towards the periphery of the circular target;
- Subsequently: along the periphery of the circular target back to 0°.

In one embodiment of the apparatus according to the invention the target center resides between the loop defined by the first magnet arrangement and the second magnet arrangement, nested in the addressed loop.

In one embodiment of the apparatus according to the invention the target center is aligned with the center line of the ring-locus.

In one embodiment of the apparatus according to the invention the loop defines a secant with respect to the circular target, departing at an angular range of 30° to 50°.

In one embodiment of the apparatus according to the invention the substrate supports are drivingly rotatable around a respective support central axis.

In one embodiment of the apparatus according to the invention the target is of silicon.

One embodiment of the apparatus according to the invention comprises a gas feed into said housing connected to a gas tank arrangement containing at least one reactive gas.

In one embodiment of the apparatus according to the invention, the addressed gas tank arrangement contains at least one of oxygen and of hydrogen.

One embodiment of the apparatus according to the invention comprises at least two of the addressed sputter sources.

One or more than one of the addressed embodiments may be combined if not contractionary.

The invention shall now further be exemplified with the help of figures.

Figure 2:
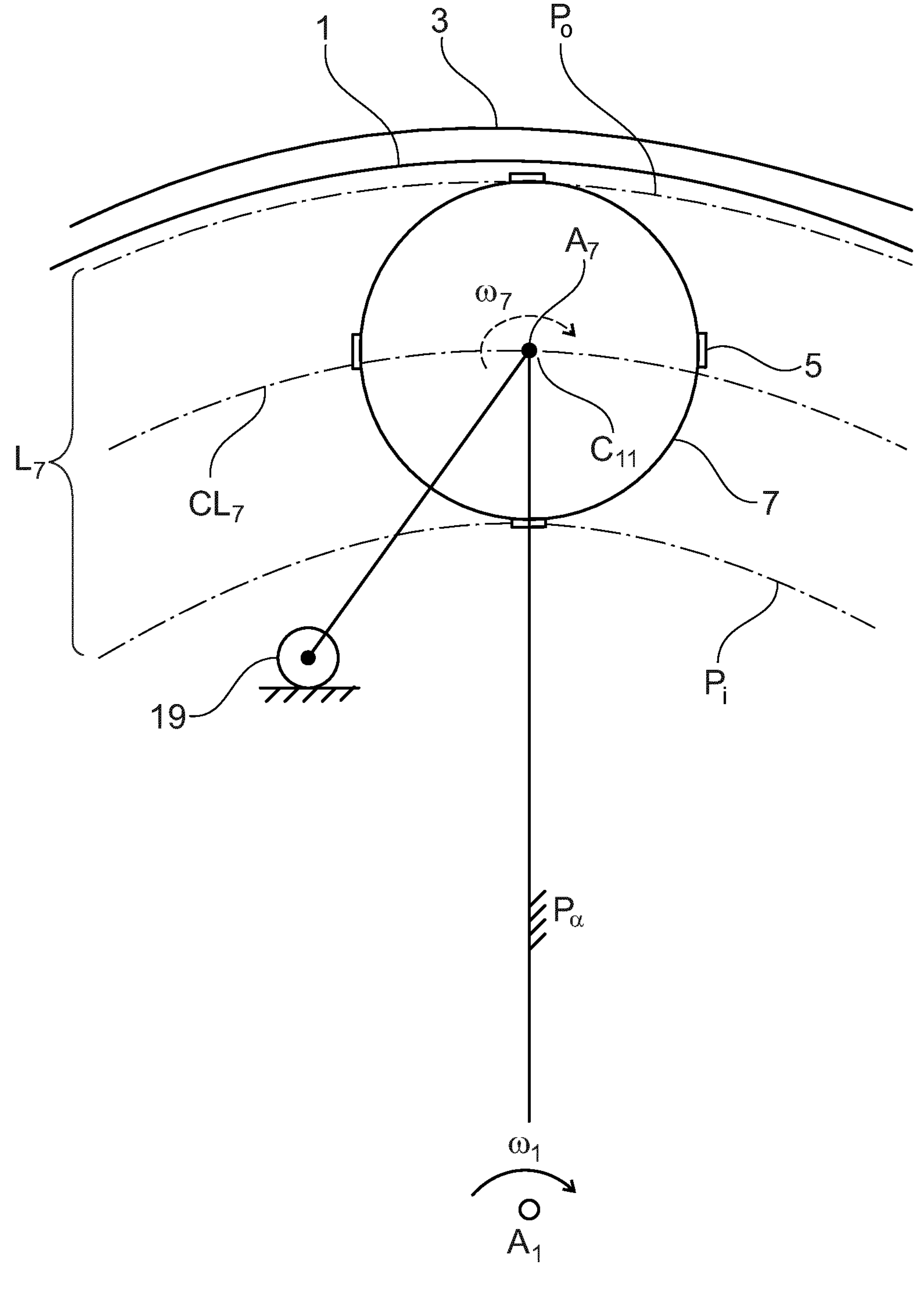
Figure 3:
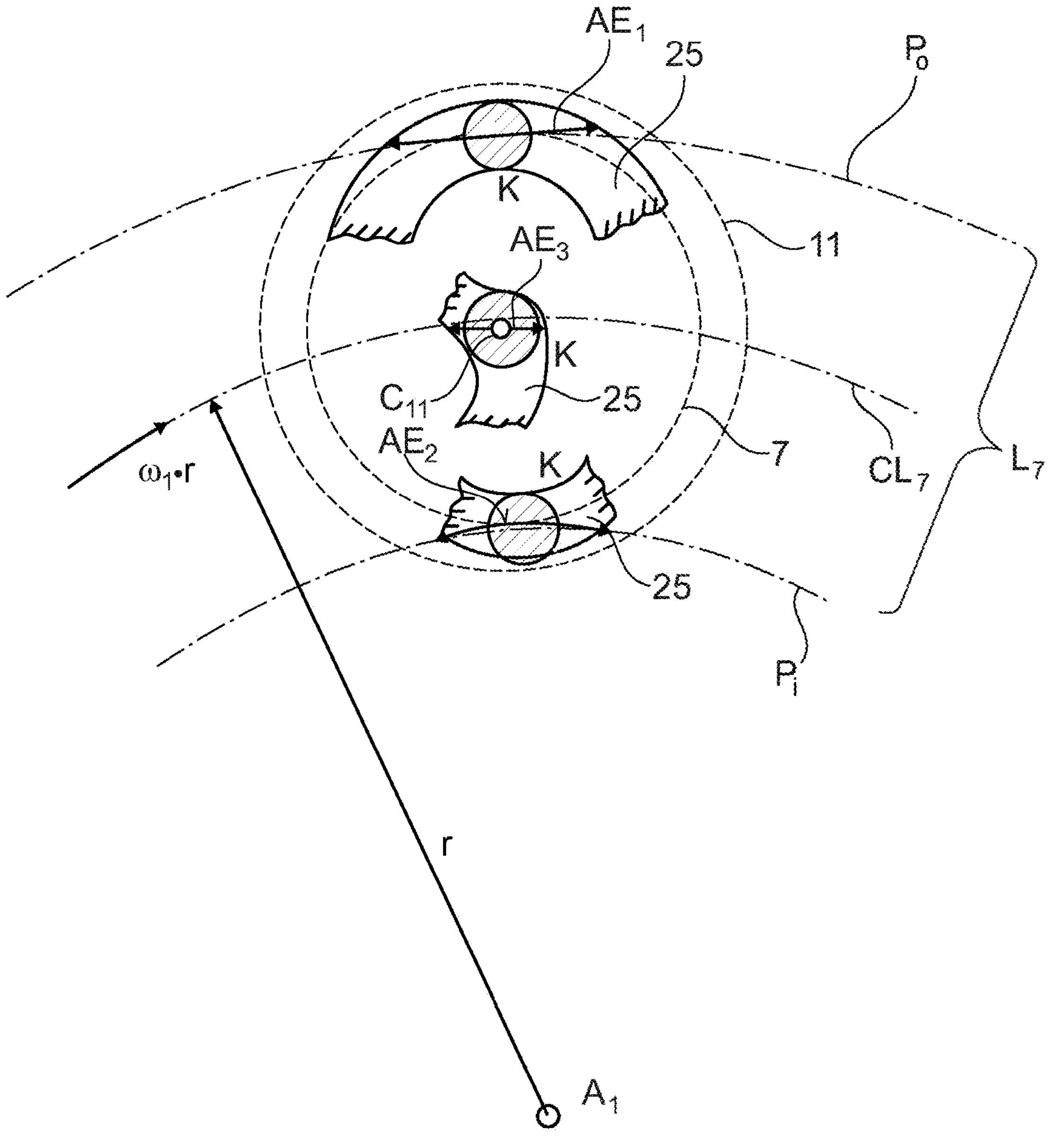
Figure 4:
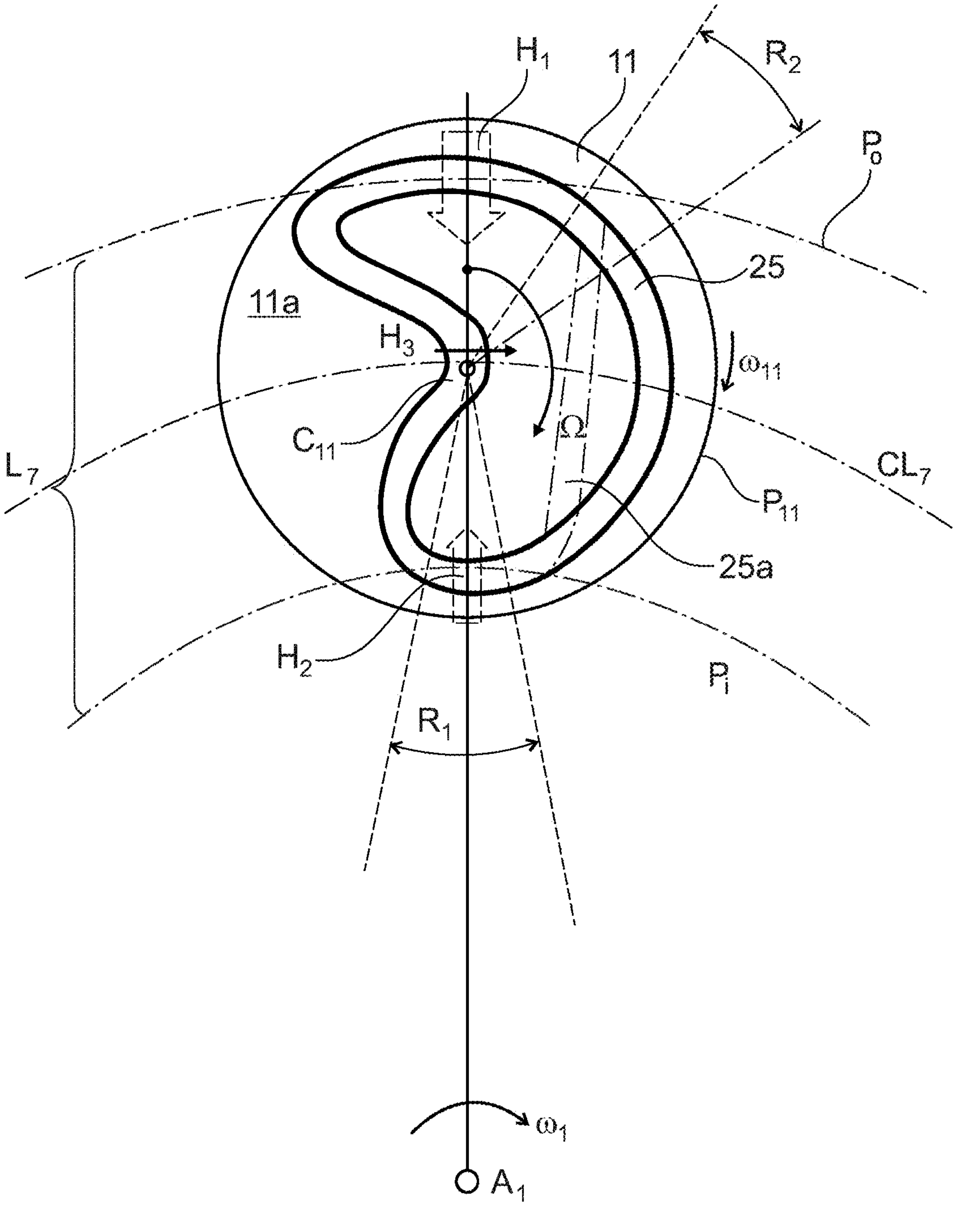
Figure 5:
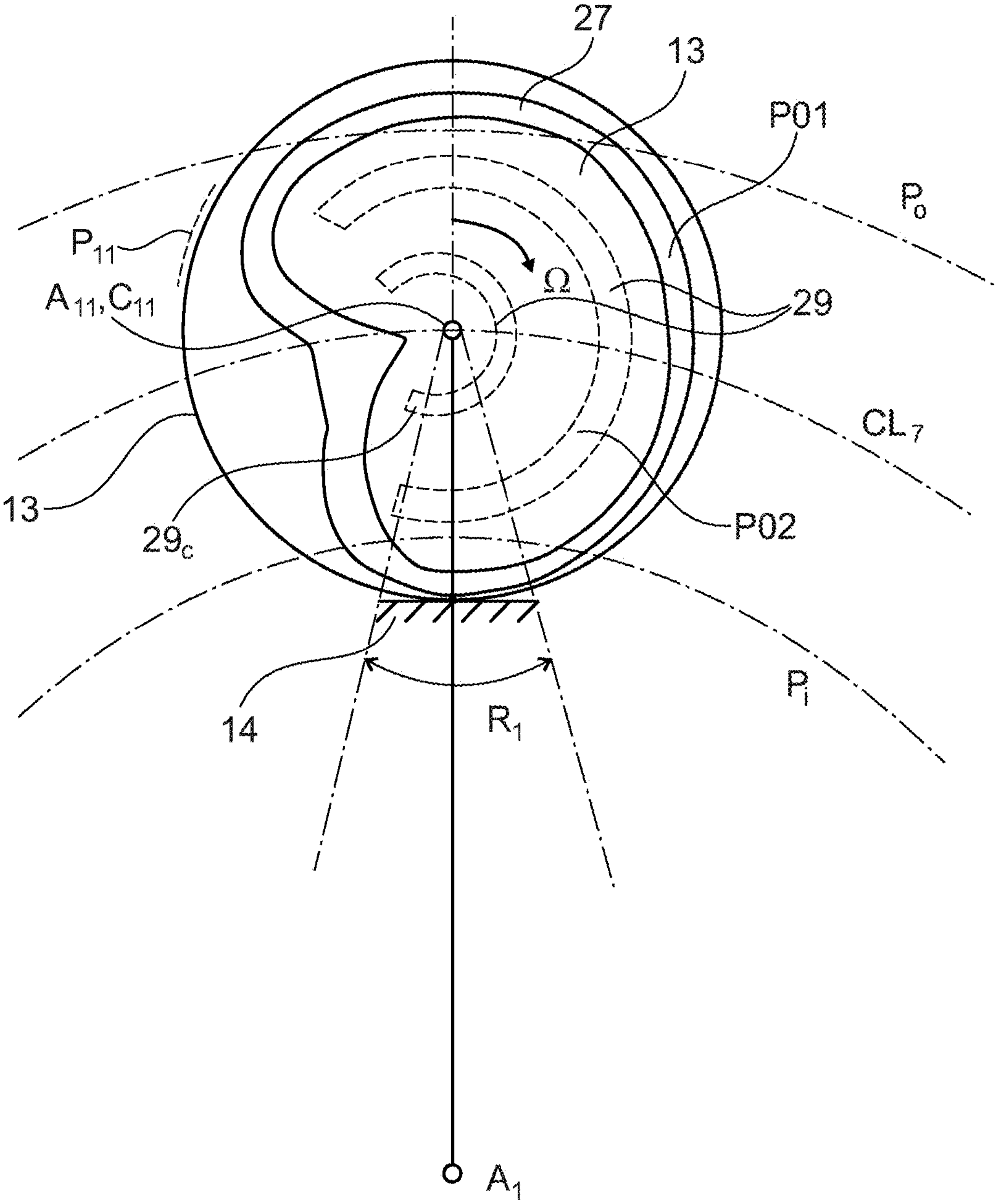
Figure 6:
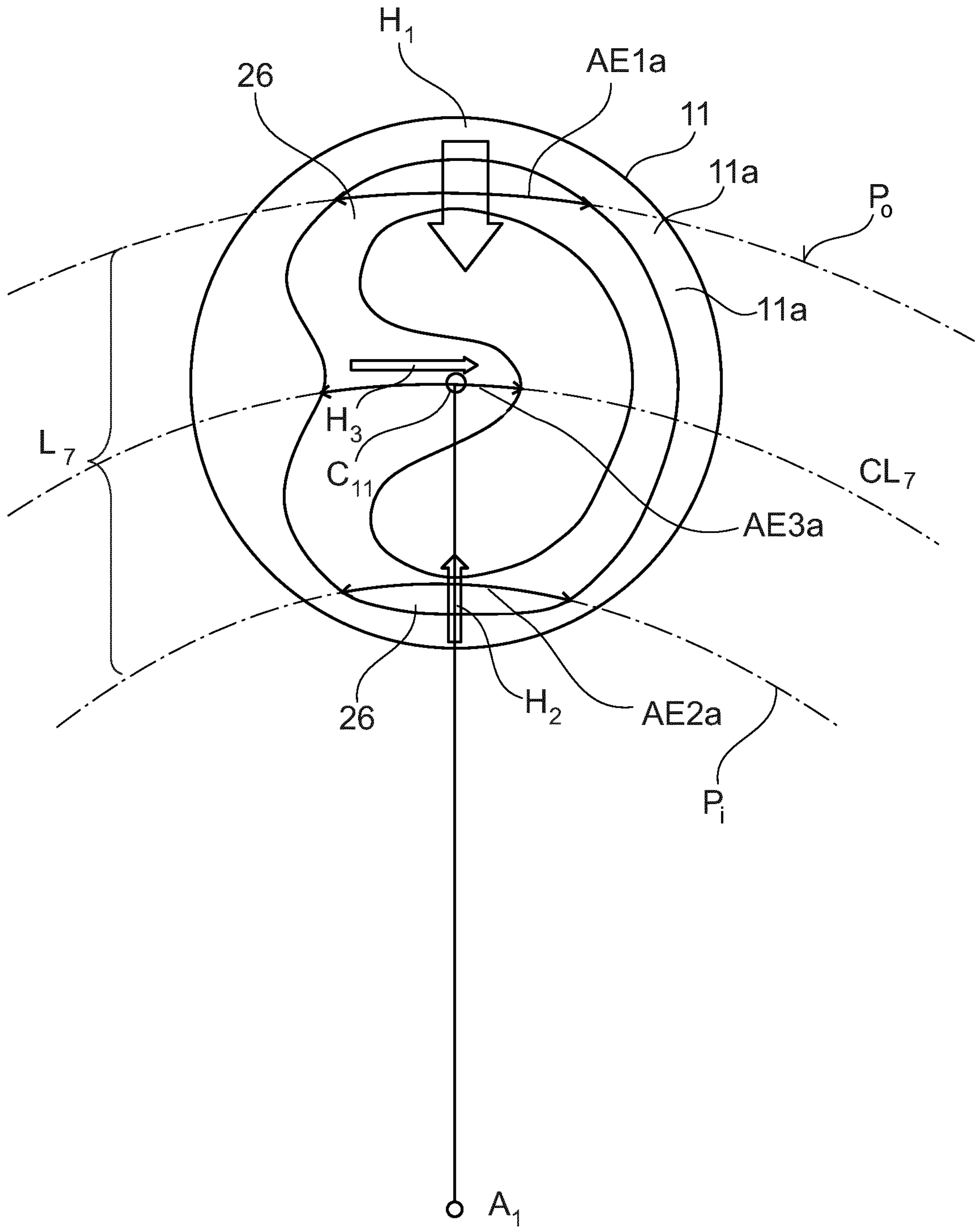
Figure 7:
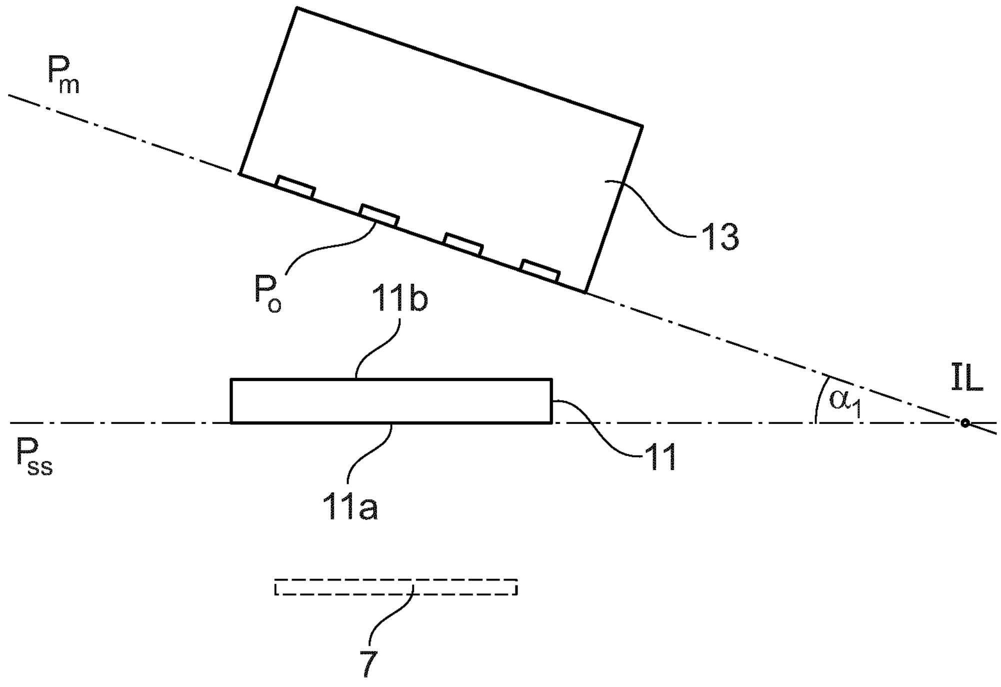
Figure 8:
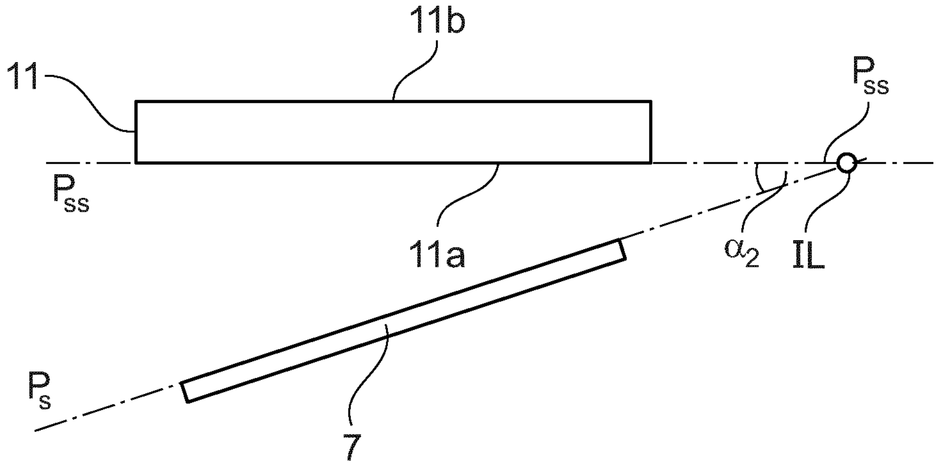
Figure 9:
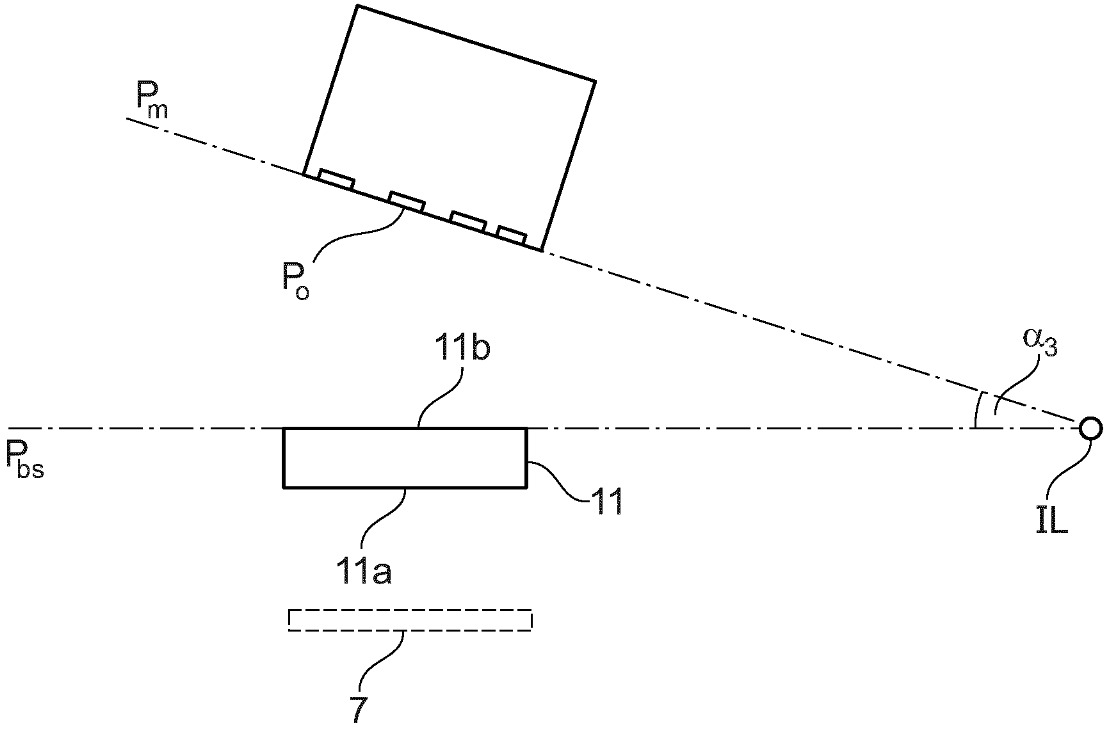
Figure 10:
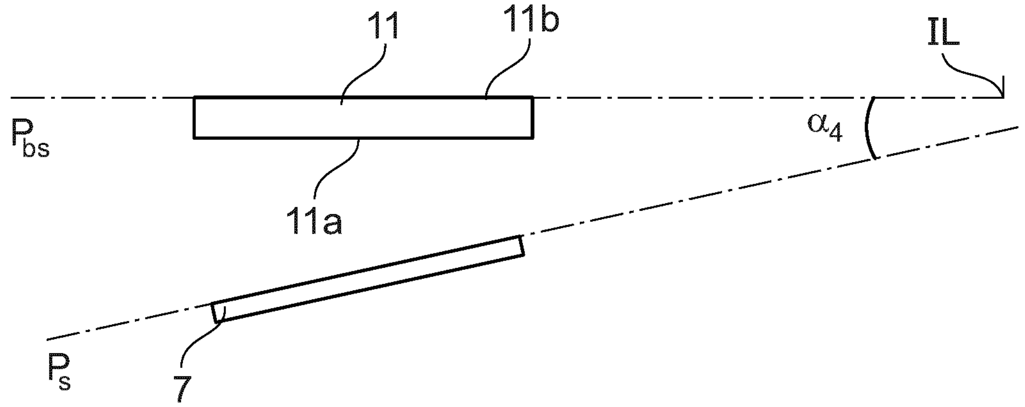
Figure 11:
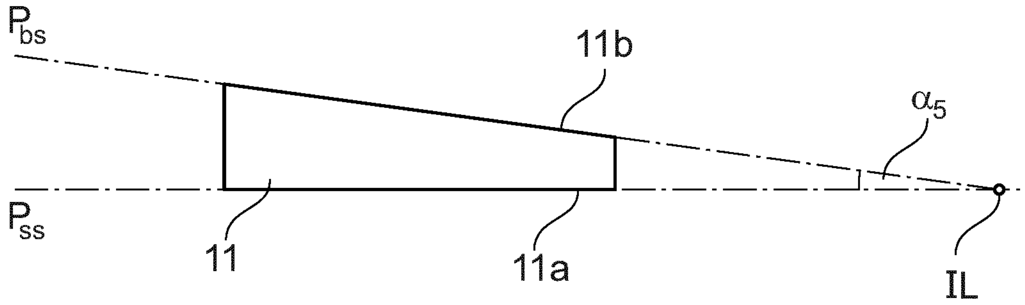
Figure 12:
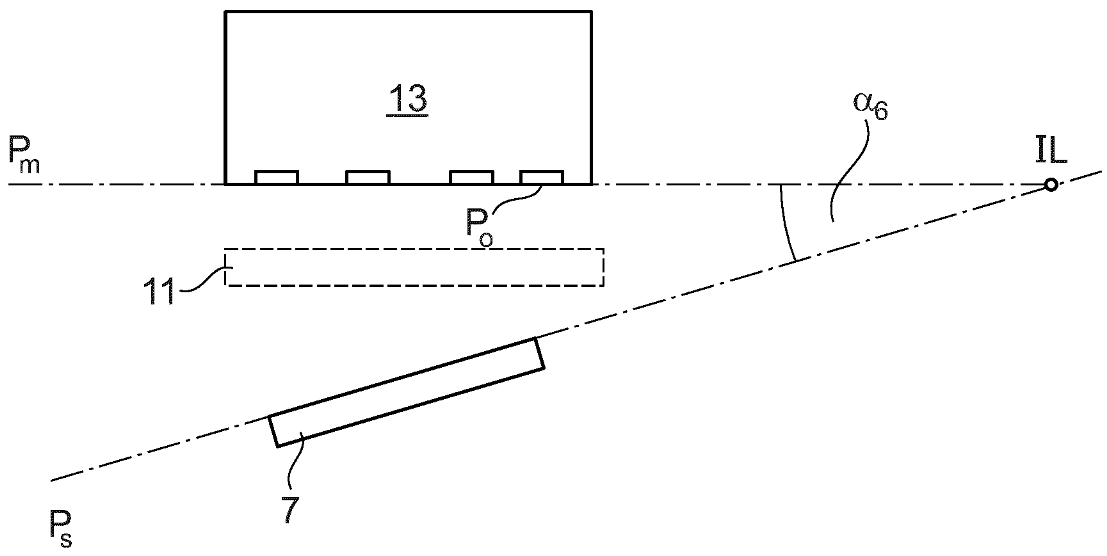
Figure 13:
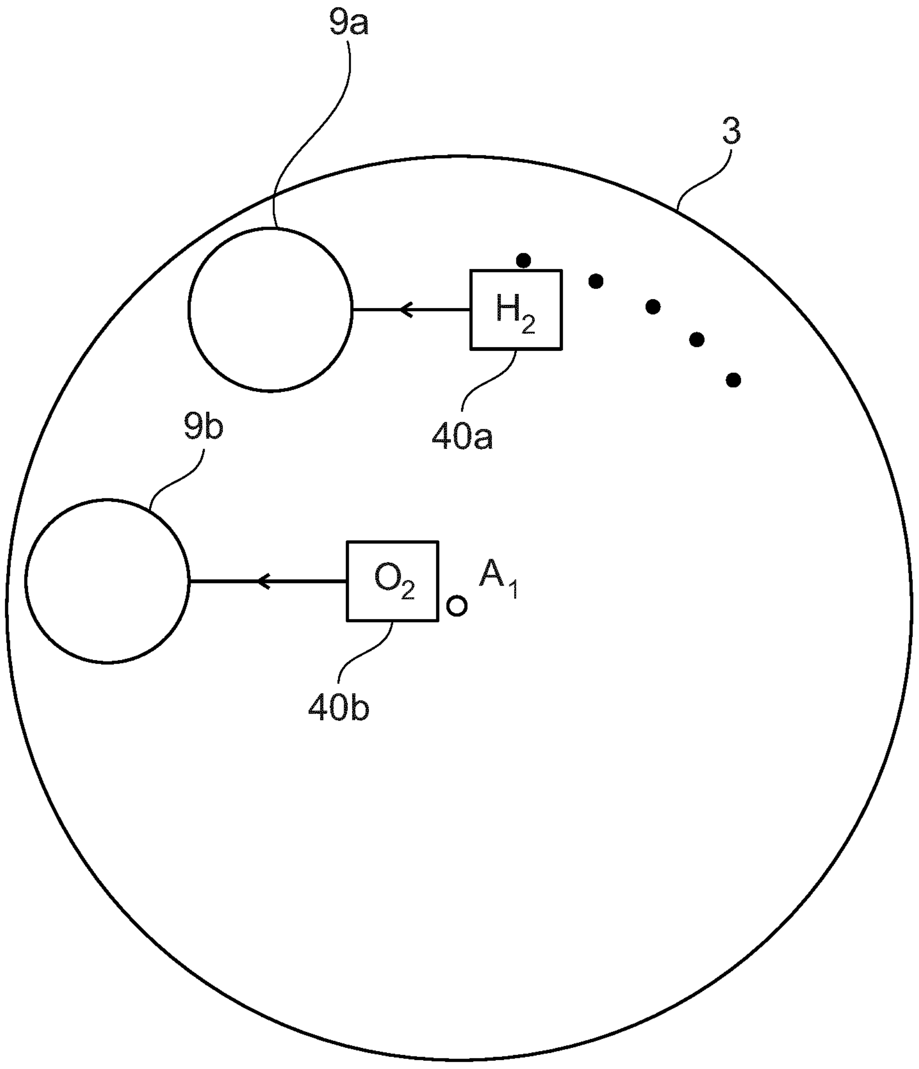

The figures show:

FIG. 1: schematically and simplified a side view on a section of an embodiment of an apparatus according to the invention;

FIG. 2: Schematically and simplified a to view on a section of the apparatus according to FIG. 1;

FIG. 3: In a representation in analogy to that of FIG. 2 of the area of magnetron plasma on the sputter surface of the target and according to an embodiment/variant of the present invention;

FIG. 4: In a representation in analogy to that of FIG. 2, qualitatively, the area of magnetron plasma along the sputter surface according to an embodiment/variant of the invention;

FIG. 5: In a representation in analogy to that of FIG. 2 qualitatively the course of magnetic pole surfaces of a magnetron magnet arrangement in an embodiment/variant according to the invention;

FIG. 6: In a representation in analogy to that of FIG. 2, qualitatively, the area of magnetron plasma along the sputter surface and the respective distribution of strength of magnetron magnetic field in an embodiment/variant of the invention;

FIG. 7: In a schematic and simplified side view representation, the mutual fine-tuning arrangement of a magnetron magnet arrangement and of a target in an embodiment/variant according to the invention;

FIG. 8: In a schematic and simplified side view representation, the mutual fine-tuning arrangement of a target and of the substrates in an embodiment/variant according to the invention;

FIG. 9: In a schematic and simplified side view representation, the mutual fine-tuning arrangement of a target and of a magnetron magnet arrangement in an embodiment/variant according to the invention;

FIG. 10: In a schematic and simplified side view representation, the mutual fine-tuning arrangement of a target and of the substrates in an embodiment/variant according to the invention;

FIG. 11: In a schematic and simplified side view representation, the mutual fine-tuning arrangement of the backside and of the sputter surface at a target in an embodiment/variant according to the invention;

FIG. 12: In a schematic and simplified side view representation, the mutual fine-tuning arrangement of a magnetron magnet arrangement and of the substrates in an embodiment/variant according to the invention;

FIG. 13: In a schematic and simplified top view representation an embodiment/variant according to the invention with at least two sputter sources according to the invention.

FIG. 1 shows most schematically and simplified in a side view representation a section of a sputter coating apparatus for substrates with two opposed two-dimensionally extended surfaces performing the methods according to the invention and FIG. 2, most schematically and simplified as well, a top view representation of the section of the apparatus according to FIG. 1.

A substrate conveyer 1 within a vacuum recipient 3—also addressed as "housing"—is continuously rotatable—ω1—around a first axis A1, driven by a drive 2. More than one or a multitude of substrate supports 5 is provided on the substrate conveyer 1, the centers C5 of the substrate supports 5 equidistant from the axis A1. The substrate supports 5 are constructed to support or hold respectively substrates 7 having two opposed two-dimensionally extended surfaces 7*a* and 7*b*. In the embodiment of FIG. 1 and as an example, the two-dimensionally extended surfaces of the substrates 7 extent along a common substrate plane E7. Nevertheless, as exemplified e.g. in FIG. 8, the substrates 7 might be arranged on the substrate supports 5 in tilted positions with respect to the plane E7. The substrates 7 may be flat as shown in FIG. 1 but may also be bent or one of the two-dimensionally extended surface may be bent, the other plane.

We understand under "a substrate" a single piece but also more than one single piece being simultaneously treated and conveyed on one substrate support 5.

The substrate supports 5 and thus also the substrates 7 are moved along a ring-locus L7 as shown in FIG. 2. The ring-locus L7 has, with respect to the first axis A1, an outer periphery Po, an inner periphery Pi and a center line Lc7 centered between the peripheries Po and Pi.

Along their rotational path, the substrates 7 on the substrate supports 5 passes at least one substrate treatment station, thereby at least one sputter source 9.

The sputter source 9 comprises a circular target 11 with a target center C11, a target center axis A11.

The target center C11, in top view, may in some embodiments and as shown in FIGS. 1 and 2 be aligned with the center line CL7. The target 11 has a sputter surface 11*a* towards the ring locus L7 and a backside 11*b* opposite the sputter surface 11*a*.

The sputter source 9 further comprises a magnetron magnet arrangement 13 facing and adjacent the backside 11*b* of the target 11. As shown schematically at 14, the magnetron magnet arrangement is stationary with respect to the vacuum recipient 3.

The target 11 and therewith a target holder 15 is rotatable with respect to the stationary magnetron magnet arrangement 13 around the target center axis A11, driven by a drive 12.

Via a rotation-contact arrangement 16 the target 11 is electrically supplied from a plasma supply source 18. If the target 11 is cooled as by a channel arrangement 20 at along the target holder 15, a liquid cooling medium M is supplied to the target holder 15 via a rotatable flow connection arrangement 22.

In FIG. 3 and in a representation in analogy to that of FIG. 2 a top view on the magnetron arrangement 13 is shown.

When the substrate 7 passes the target 11 at a constant angular velocity—ω1—the azimuthal speed va of each area of the substrate 7 is proportional to the radial distance r from the first axis A1. Assuming a predetermined sputter area K on the sputter surface 11*a* as shown in FIG. 3, it may be seen that the time span a given area of the substrate 7 is exposed to such sputter area K is diminishing the larger the radial spacing r becomes.

According to the invention and under a first approach the azimuthal extent of the area of magnetron plasma is adapted to the azimuthal speed va of different substrate areas with respect to the first axis A1 and to the azimuthal extent a substrate area passes over the sputter surface 11*a* of the target 11.

To do so and according to FIG. 3 the magnetron magnet arrangement 13 is constructed so that a first azimuthal extent AE1 is generated in the area of magnetron plasma 25 closer to the outer periphery Po of the ring L7-locus than to the inner periphery Pi of the ring-locus L7. According to the embodiment of FIG. 3, the first azimuthal extent AE1 resides adjacent and along—or neighboring—the outer periphery Po of the ring-locus L7.

A second azimuthal extent AE2 is generated in an area of the magnetron plasma 25 closer to the inner periphery Pi of the ring-locus L7 than to the outer periphery Po of the ring-locus L7. This second azimuthal extent AE2 is shorter than the first azimuthal extent AE1. According to the embodiment of FIG. 3, the second azimuthal extent AE2 resides adjacent and along—or neighboring—the inner periphery Pi of the ring-locus L7.

The target shall be sputtered off all along its sputter surface, on one hand to improve exploitation of target material, on the other hand—and of predominant importance when performing reactive sputtering—to minimize or even avoid net redeposition of material on the sputter surface 11*a*.

Therefore, the target 11 is rotated relative to the stationary magnetron arrangement 13 and thus relative to the stationary area of magnetron plasma 25 as of FIG. 3.

As rotation of the target around axis A11 does not displace the target center C11 and this center area as well is to be sputtered off, a third azimuthal extent AE3 in the area of magnetron plasma 25 is generated by the magnetron magnet arrangement 13 which is shorter than the second azimuthal area AE2 and thus presents a constriction of the loop of the area of magnetron plasma 25. Thereby and irrespective of the rotation of the target 11, the target center C11 is sputtered off during a time span which is shorter than the time spans the target areas nearer to the peripheries Po and Pi are sputtered off, thus reducing the overall erosion of the target center C11 to become at least similar to the erosion amount nearer to the peripheries Po, Pi.

According to FIG. 4, showing the area of magnetron plasma 25 as generated according to an embodiment of the method according to the invention and by an embodiment of the magnetron magnet arrangement 13 of the apparatus according to the invention, the area of magnetron plasma 25 is located along the periphery P11 of the target 11 starting at an angle Ω of 0° up to an angle Ω in the range R1:

$$170° \leq \Omega \leq 190°.$$

Please note that the angle Ω is defined in the target center as origin and at angle value zero in outwards direction of the radial connecting line of the target center C11 and the first axis A1.

Subsequently the area of magnetron plasma 25 bends towards the target center C11, passes over the target center C11 and bends outwards to again propagate along the periphery P11 of the target, back to Ω=0°.

Please note, that according to FIG. 4 as well, and as an example, the target center C11 is aligned with the center line CL7 of the ring-locus L7. It is absolutely possible to locate the target center C11 shifted towards one of the peripheries Po or Pi of the ring-locus L7.

Further and with an eye on FIG. 3 the azimuthal extent AE3 needs not necessarily be centered between the azimuthal extents AE1 and AE2, considered in radial direction with respect to the first axis A1. Accordingly and with an eye on FIG. 4 the target center C11 and the respective section of the magnetron plasma 25, covering the target center C11, need not necessarily be centered between the outermost and the innermost parts of the magnetron plasma 25, considered in radial direction, with respect to the first axis A1.

An even more accurate effect is achieved, with respect to avoiding thickness variations of the sputter deposited layer on the substrate 7, due to substrate rotation around the first axis A1 and of sputtering the entire sputter surface 11*a*, if the area of magnetron plasma 25 follows the periphery P11 of the target 11 as a secant 25*a*, as shown in dash-dotted lines, departing at a range R2 for Ω of $$30° \leq \Omega \leq 50°.$$

FIG. 5 shows qualitatively the magnetron magnet arrangement 13 in a top view.

A first magnet arrangement 27 of the stationary magnetron magnet arrangement 13 defines a closed loop of subsequent pole surfaces PO1 of one magnet polarity. That the magnetron magnet arrangement 13 is, and thus the pole surfaces PO1 are stationary is represented in FIG. 5 at 14. The magnet pole surfaces PO1 face the backside 11*b* of the target 11, which latter is not shown in FIG. 5. The loop is thereby not necessarily formed by a respective, uninterrupted series of magnet pole surfaces PO1, but is just defined by the localization of multiple magnetic pole surfaces PO1.

The loop as defined by the magnet pole surfaces PO1 of the one magnetic polarity is located following the periphery P11 of the target 11 thereby starting at an angle Ω of 0° up to an angle Ω in the range R1:

$$170^\circ \leq \Omega \leq 190^\circ.$$

Subsequently the loop of as defined by the magnet pole surfaces PO1 of the first magnet arrangement 27 bends towards the target center C11, passes nearby the target center C11 and bends outwards to again propagate along the periphery P11 of the target back to Ω=0°.

In dash line, FIG. 5 shows, as an example the second magnet arrangement 29 of the magnetron magnet arrangement 13, as defined by an arrangement of second magnet pole surfaces PO2 of the second magnet polarity, and nested in the loop as defined by the first magnet pole surfaces PO1 of the first magnet arrangement 27. The second magnet arrangement 29 provides magnet pole surfaces PO2 of the second magnet polarity facing the backside 11*b* of the target 11. The second magnet arrangement 29 comprises a center area 29*c*. The target center C11 resides between the center area 29*c* of the second magnet arrangement 29 and the area as defined by the magnetic pole surfaces PO1 of the first magnet arrangement 27 nearby the target center C11.

As not shown in FIG. 5 the secant 25*a* of the area of magnetron plasma 25 as of FIG. 4 is realized by a respective secant of the loop as defined by the first magnet arrangement 27 departing at the range R2 for Ω of $$30^\circ \leq \Omega \leq 50^\circ.$$

Up to now and under a first approach of the invention, we have described the stationary area of magnetron plasma 25 and the respective, stationary first magnet arrangement 27 of the magnetron magnet arrangement 13 combined with the rotating target 11 and a continuously rotating substrate conveyer 1, and thus substrates 7, for minimizing thickness variations of the sputter deposited layer and achieving all-over net sputtering of the sputter surface 11*a* by selectively tailoring the azimuthal extent of the areas of magnetron plasma which are passed by different areas of the substrates, differently spaced from the first axis A1.

A second approach to resolve object as addressed above shall be explained with the help of FIG. 6 which shows the sputter surface 11*a* of the target 11 and differs from the embodiment or variant of FIG. 4 with respect to the course of the area of magnetron plasma 26.

The azimuthal extents AE1*a* to AE3*a* are at least similar and differences do not suffice to minimize variations of thickness of the sputter deposited layer on the substrates 7 as desired.

Instead of tailoring the course of the looping area of the area of magnetron plasma, as of loop 25 of the embodiment of FIG. 4, in this approach the strength of magnetic field averaged over the respective azimuthal extents AE1*a* to AE3*a* is appropriately varied along the loop of the area of magnetron plasma 26.

In an area of the sputter surface 11*a* where the substrates 7 pass the target 11 along the azimuthal pass closer to the outer periphery Po of the ring-locus L7 than to the inner periphery Pi of the ring locus, according to the embodiment as shown in FIG. 6, closely along or neighboring the periphery Po, a first averaged magnetron magnetic field strength H1 is applied.

In an area where the substrates 7 pass the target 11 along the azimuthal pass AE2 closer to the inner periphery Pi of the ring-locus L7 than to the outer periphery Po of the ring-locus L7, a second averaged magnetron magnetic field strength H2 is applied. The averaged strength H2 is smaller than the averaged strength H1 as schematically represented by the respective thicknesses of the arrows respectively representing the strengths of the magnetron magnetic field. In the embodiment of FIG. 6 the azimuthal pass AE2*a* is selected closely along or neighboring the inner periphery Pi.

In a third azimuthal pass AE3*a* along which the substrates 7 pass the target center C11, a third averaged magnetron magnetic field strength H3 is applied, which is smaller than the second averaged strength H2 of the magnetron magnetic field.

Here again we mention, that the target canter C11 needs not necessarily be aligned with the center line CL7 of the ring-locus L7, as shown in the embodiment of FIG. 6, but may be located displaced from the center line CL7 in radial direction with respect to the first axis A1.

Further the third azimuthal pass AE3*a* needs not necessarily be centered between the azimuthal passes AE1*a* and AE2*a* as shown in the embodiment of FIG. 6 and considered in radial direction with respect to the first axis A1.

As perfectly known to the artisan skilled in magnetron art, magnetron magnetic fields of the different strength H1 to H3 are realized by providing at the magnetron magnet arrangement 13 a number of magnetic pole surfaces which respectively vary along the first and/or second magnet arrangements of the magnetron magnet arrangement 13 and/or by varying the strength of magnets along the first and/or second magnet arrangements.

It is absolutely possible to combine the approach according to the embodiment of FIGS. 4 and 5 with the approach according to the embodiment of FIG. 6. Thereby and with an eye on the embodiment according to FIG. 4, the averaged strengths of the magnetron magnetic field may be varied as exemplified in dash line by the arrows H1 to H3 in FIG. 4.

The substrates 7 are in one embodiment and as exemplified in the figures circular and in one embodiment rotated—ω7—around respective substrate central axes A7 located along the center line CL7, at least during exposure to the sputter surface 11*a* of the target 11 by a drive 19 and as schematically shown in FIG. 2.

As perfectly known to the skilled artisan in magnetron art, the magnet pole surfaces PO1, PO2 may be realized by at least two permanent magnet arrangements connected in series and linked by a yoke arrangement or are realized by surfaces of pole shoes connected to one or more than one (in series) permanent magnets or by combining such approaches.

The deposition rate of sputtered material, possibly reacted with a reactive gas, is influenced by at least one of a) the spacing between the sputter surface 11*a* and the pole surfaces of the magnetron magnet arrangement 13 facing the backside 11*b* of the target 11, b) by the spacing between the sputter surface 11*a* and the substrate, c) by the spacing between the backside 11*b* of the target and the pole surfaces of the magnetron magnet arrangement 13, d) by the spacing between the backside surface 11*b* and the substrate, e) by the spacing between the sputter surface 11*a* and the backside 11*b* of the target 11, f) by the spacing between the substrate and the pole surfaces of the magnetron magnet arrangement 13.

Therefore fine tuning of the deposition rate distribution may be performed by selectively varying one or more than one of the addressed spacings at the sputter source 9 and/or between the respective parts of the sputter source 9 and the substrates 7 aligned with the sputter source 9 by the rotation—ω1—around the first axis A1.

FIG. 7 shows schematically and simplified exploiting the influence according to (a) for fine tuning the distribution of deposition rate on the substrates 7 as well net sputtering of the overall sputter surface 11*a*.

The sputter surface 11*a* of the target 11 in a new state, i.e. yet un-sputtered, extends along a sputter surface plane Pss. The magnetic pole surfaces PO1, PO2 of the magnetron magnet arrangement 13, schematically shown in FIG. 7 at PO, extend along or define a magnet arrangement plane Pm.

The sputter surface plane PSS and the magnet arrangement plane Pm may be arranged to mutually intersect with an angle α1, selected to fine tune the thickness homogeneity of the layer deposited on the substrates 7 as well as net sputtering of the overall sputter surface 11*a*.

FIG. 8 shows schematically and simplified exploiting the influence according to (b) for fine tuning the distribution of deposition rate on the substrates 7 as well as net sputtering of the overall sputter surface 11*a*.

A substrate 7, when aligned with the sputter source 9, extends along a substrate plane Ps.

The sputter surface plane PSS and the substrate plane PS may be arranged to mutually intersect with an angle α2, selected to fine tune the thickness homogeneity of the layer deposited on the substrates 7 as well as net sputtering of the overall sputter surface 11*a*.

FIG. 9 shows schematically and simplified exploiting the influence according to (c) for fine tuning the distribution of deposition rate on the substrates 7 as well as net sputtering of the overall sputter surface 11*a*.

The backside 11*b* of the target 11 extends along a backside plane Pbs.

The backside plane Pbs and the magnet arrangement plane Pm may be arranged to mutually intersect with an angle α3, selected to fine tune the thickness homogeneity of the layer deposited on the substrates 7 as well as net sputtering of the overall sputter surface 11*a*.

FIG. 10 shows schematically and simplified exploiting the influence according to (d) for fine tuning the distribution of deposition rate on the substrates 7 as well as net sputtering of the overall sputter surface 11*a*.

The backside plane Pbs and the substrate plane PS may be arranged to mutually intersect with an angle α4, selected to fine tune the thickness homogeneity of the layer deposited on the substrates 7 as well as net sputtering of the overall sputter surface 11*a*.

FIG. 11 shows schematically and simplified exploiting the influence according to (e) for fine tuning the distribution of deposition rate on the substrates 7 as well as net sputtering of the overall sputter surface 11*a*.

The backside plane Pbs and the sputter surface plane PSS may be arranged to mutually intersect with an angle α5, selected to fine tune the thickness homogeneity of the layer deposited on the substrates 7 as well as net sputtering of the overall sputter surface 11*a*.

FIG. 12 shows schematically and simplified exploiting the influence according to (f) for fine tuning the distribution of deposition rate on the substrates 7 as well as net sputtering of the overall sputter surface 11*a*.

The magnet arrangement planes Pm and the substrate plane PS may be arranged to mutually intersect with an angle α6, selected to fine tune the thickness homogeneity of the layer deposited on the substrates 7 as well as net sputtering of the overall sputter surface 11*a*.

The mutual tilting of the respectively addressed two planes may be realized in any direction. As has been addressed the thickness variations of the material layer deposited on the substrates 7 are caused by the different radial spacings of substrate areas from the first axis A1.

To perform fine tuning in radial direction, with respect to the first axis A1, the addressed tiltings of the respective two planes is, in one embodiment, provided so that the respective intersection lines IL of the addressed two planes is perpendicular to a plane Pα (FIG. 2) which contains the first axis A1 and the target center C11.

The addressed mutual tiltings of the respective pair of planes with tilting angles α1 to α6 are selected in a range of $$0° < \alpha \leq 10°.$$

In one variant of the method or embodiment of the apparatus according to the invention, the material of the target 11 is silicon. In view of the fact, that silicon is a relatively low-cost material, optimum exploitation of the target material is of secondary importance, of primary importance is that the complete sputter surface 11*a* of the target 11 is net sputtered off.

This is especially evident if magnetron sputtering is performed in an atmosphere containing at least one reactive gas and coating material is deposited on the substrates 7 which comprises target material reacted with one or more than one reactive gas, thus a material which is different from the target material. Net redeposition of coating material on the sputter surface 11*a* may be said target poisoning and is minimized or even avoided by the methods and apparatus according to the invention.

In FIG. 1 a tank arrangement 40 containing at least one reactive gas G is in flow connection with the sputter source 9 either directly, as shown, or via a section of the vacuum recipient 3 (not shown).

According to the schematic and simplified top view of FIG. 13 on an apparatus according to the invention, performing the methods according to the invention, at least two of the sputter sources 9 namely sputter sources 9*a*, 9*b* are provided. Additional treatment sources for the substrates 7 may be provided along the ring locus L7 (not shown in FIG. 13).

In one embodiment/variant of the invention the at least two sputter source 9*a*, 9*b*, both realized according to the invention, have respective targets 11 of silicon. One of the at least two sputter sources, e.g. source 9*a* according to FIG. 13, performs reactive sputtering of the silicon target in an atmosphere containing hydrogen from a tank arrangement 40*a*, the second sputter source 9*b* of the at least two sputter sources performs reactive sputtering in an atmosphere containing oxygen, from a tank arrangement 40*b*.

What is claimed is:

1. An apparatus for sputter coating substrates with two opposed two-dimensionally extended surfaces comprising:

a substrate conveyer in a housing drivingly rotatable around a first axis and comprising substrate supports, radially equally distant from said first axis, said substrate supports being thereby rotationally movable along a ring-locus, said ring-locus having, considered in radial direction with respect to said first axis, an outer periphery, an inner periphery and a center line;

a sputter source comprising a circular target that is planar with a sputter surface towards said ring-locus, a target center on said sputter surface, a target center axis and a backside opposite said sputter surface, said sputter source further comprising a stationary magnetron magnet arrangement facing said backside;

said stationary magnetron magnet arrangement comprising a first magnet arrangement defining an outer closed loop of magnet pole surfaces of one magnetic polarity facing said backside and a second magnet arrangement with magnet pole surfaces of another magnetic polarity facing said backside and nested within said outer closed loop;

said first magnet arrangement and said second magnet arrangement generating a closed loop area of magnetron magnetic field;

a first azimuthal extent of a first area of said closed loop area of magnetron magnetic field along a first circle locus around said first axis and radially closer to said outer periphery of said ring-locus than to said inner periphery of said ring-locus, wherein the first azimuthal extent is defined by an overlap of said closed loop area and said outer periphery of said ring-locus;

a second azimuthal extent of a second area of said closed loop area of magnetron magnetic field along a second circle locus around said first axis and radially closer to said inner periphery of said ring-locus than to said outer periphery of said ring-locus, wherein the second azimuthal extent is defined by an overlap of said closed loop area and said inner periphery of said ring-locus;

a third azimuthal extent of a third area of said closed loop area of magnetron magnetic field along a third circle locus around said first axis and radially located between said first and said second circle locus, wherein the third azimuthal extent is defined by an overlap of said closed loop area that overlaps with said center line of said ring-locus;

said target center being located in said third area;

said circular target being drivingly rotatable around said target center axis;

wherein at least one of the following is valid:

A) said second azimuthal extent is shorter than said first azimuthal extent and said third azimuthal extent is shorter than said second azimuthal extent;

B) a first averaged magnetron magnetic field strength along said first area is greater than a second averaged magnetron magnetic field strength along said second area and said second averaged magnetron magnetic field strength is greater than a third averaged magnetron magnetic field strength along said third area.

2. The apparatus of claim 1, wherein said third circle locus is, with respect to said first axis, radially centered between said first and said second circle locus.

3. The apparatus of claim 1 or 2, wherein said third circle locus is, with respect to said first axis, radially aligned with said center line of said ring-locus.

4. The apparatus of claim 1, comprising at least two planes of the following:

a) said sputter surface in new yet un-sputtered state extends along a sputter surface plane;

b) magnet pole surfaces of said stationary magnetron magnet arrangement extend along a magnet arrangement plane;

c) a substrate aligned with said sputter source extends along a substrate plane;

d) a target backside extends along a backside plane;

wherein said at least two planes intersect at an angle $\alpha$:

$$0° < \alpha \leq 20°.$$

5. The apparatus of claim 4, wherein said at least two planes intersect along a line perpendicular to a plane containing said first axis and said target center.

6. The apparatus of claim 4, wherein the following is valid for the angle $\alpha$:

$$0° < \alpha \leq 10°.$$

7. The apparatus of claim 1, wherein said first magnet arrangement defining said outer closed loop extends around said target center and starting at an angle $\Omega=0°$ with reference to an outwards radial direction from said first axis through said target center:

from $\Omega2=0°$ up to $\Omega$ in a range from 170° to 190°, along a periphery of said circular target, subsequently, bent inward to pass close to said target center, subsequently, bent outwards towards said periphery of said circular target;

subsequently, again along said periphery of said circular target back to $\Omega=0°$.

8. The apparatus of claim 1, wherein said target center resides between said outer closed loop defined by said first magnet arrangement and said second magnet arrangement, nested in said outer closed loop.

9. The apparatus of claim 1, wherein said target center is aligned with said center line of said ring-locus.

10. The apparatus of claim 7, wherein said outer closed loop defines a secant with respect to said circular target, departing at an angle in a range from 30° to 50°.

11. The apparatus of claim 1, wherein said substrate supports are drivingly rotatable around a respective support central axis.

12. The apparatus of claim 1, wherein said circular target is made of silicon.

13. The apparatus of claim 1, comprising a gas feed into said housing connected to a gas tank arrangement containing at least one reactive gas.

14. The apparatus of claim 13, wherein said gas tank arrangement contains at least one of oxygen and hydrogen.

15. The apparatus of claim 1, comprising at least two sputter sources.

16. The apparatus of claim 1, wherein said second magnet arrangement comprises a first magnet pole surfaces and a second magnet pole surface, wherein the second magnet pole surfaces is nested within the first magnet pole surfaces.

17. The apparatus of claim 16, wherein said second magnet pole surface is located in a center area of said circular target, wherein said target center resides within both the center area and an area as defined by the magnetic pole surfaces of said first magnet arrangement.

* * * * *